US006994926B2

(12) United States Patent
Ikeuchi et al.

(10) Patent No.: US 6,994,926 B2
(45) Date of Patent: Feb. 7, 2006

(54) BATTERY PACK AND METHOD OF PRODUCING THE SAME

(75) Inventors: Kiyoshi Ikeuchi, Nishinomiya (JP); Yasukazu Koyama, Kadoma (JP)

(73) Assignee: Matsushita Electric Industrial Co., Ltd., (JP)

( * ) Notice: Subject to any disclaimer, the term of this patent is extended or adjusted under 35 U.S.C. 154(b) by 346 days.

(21) Appl. No.: 10/311,631

(22) PCT Filed: Jun. 21, 2001

(86) PCT No.: PCT/JP01/05332

§ 371 (c)(1),
(2), (4) Date: Feb. 11, 2003

(87) PCT Pub. No.: WO01/99211

PCT Pub. Date: Dec. 27, 2001

(65) Prior Publication Data

US 2003/0157399 A1      Aug. 21, 2003

(30) Foreign Application Priority Data

Jun. 22, 2000  (JP) .............................. 2000-187265

(51) Int. Cl.
*H01M 10/50* (2006.01)
(52) U.S. Cl. ............................ 429/7; 429/62; 29/623.1
(58) Field of Classification Search .................... 429/7, 429/62; 29/623.1
See application file for complete search history.

(56) References Cited

U.S. PATENT DOCUMENTS

| 6,177,209 B1 * | 1/2001 | Okutoh ......................... 429/62 |
| 6,432,575 B1 * | 8/2002 | Yamagami .................. 429/7 X |
| 6,492,058 B1 * | 12/2002 | Watanabe et al. ............ 429/121 |
| 6,617,069 B1 * | 9/2003 | Hopper et al. ............. 429/62 X |

FOREIGN PATENT DOCUMENTS

| JP | 7-57721 | 3/1995 |
| JP | 7-130342 | 5/1995 |
| JP | 8-167433 | 6/1996 |
| JP | 8-329913 | 12/1996 |
| JP | 10-144356 | 5/1998 |
| JP | 2000-40503 | * 2/2000 |
| WO | WO 92/09993 | 6/1992 |

* cited by examiner

*Primary Examiner*—Stephen J. Kalafut
(74) *Attorney, Agent, or Firm*—Steptoe & Johnson LLP

(57) ABSTRACT

The protection circuit unit 52 is an integrated body comprising a surface-mount type PTC thermistor 49 mounted by a soldering on a printed circuit board 44 through reflow soldering or the like soldering method together with a protection IC 45 and a FET unit 46. The surface-mount type PTC thermistor 49, as compared with a PTC thermistor with leads, can be mounted readily on the printed circuit board 44, without requiring bending and welding work of a lead to be connected to a negative terminal of prismatic battery cell 41, for forming a circuit. As a result, change in a resistance due to a bending stress, a thermal stress, etc. can be eliminated. Furthermore, a degree of thermal coupling with the battery cell 41 can be adjusted by changing a location of the thermistor 49. Thus, varieties of control functions can be implemented.

28 Claims, 10 Drawing Sheets

Thermal coupling

BATTERY PACK AND METHOD OF PRODUCING THE SAME

TECHNICAL FIELD

The present invention relates to a battery pack having a function for protecting the battery pack from overcurrent or over heat, and the method for manufacturing the battery pack.

BACKGROUND ART

A conventional battery pack disclosed in the Japanese Laid-open Patent No. H7-57721 is described with reference to drawings.

FIG. 10A is a cross sectional view, as viewed from the top, of a conventional battery pack with key part, where part of the case have been cut off. FIG. 10B is a cross sectional front view with key part, where part of the case have been cut off.

Referring to FIG. 10A and FIG. 10B, a battery pack 12 comprises a first battery cell 1, a second battery cell 4, and a thermistor 7 with leads, which have been packed in a case 9. The first battery cell 1 has a protruding positive terminal 2 and a negative terminal 3 provided at the opposite surface. The second battery cell 4 likewise has a protruding positive terminal 5 and a negative terminal 6. The PTC thermistor 7 with leads is connected, both mechanically and electrically, with the pair of leads to the positive terminal 2 of first battery cell 1 and the negative terminal 6 of second battery cell 4, respectively. The case 9 is provided with through holes 10, 11 for leading electrical contacts from the negative terminal 3 and the positive terminal 5 out of the case.

Now a PTC thermistor used in battery pack 12 is described referring to the drawings. FIG. 11A is a top view of a PTC thermistor with leads, FIG. 11B is a cross sectional view of the thermistor sectioned along the line A—A of FIG. 11A. Referring to FIG. 11A and FIG. 11B, a PTC thermistor 15 with leads comprises a polymer PTC layer 16, a pair of electrode layers 17 provided on both surfaces of the polymer PTC layer 16 with electrical contact thereto, a pair of lead terminals 18 attached to the electrode layer 17, and an insulating resin 19 covering the polymer PTC layer 16 and the electrode layers 17, and part of the lead terminals 18.

Operation of the above-configured PTC thermistor with leads and the conventional battery pack is described below. First, operation of the PTC thermistor with leads is described.

In FIG. 11B, the polymer PTC layer 16 is formed of a mixture of polyethylene or the like crystalline resin and carbon black or the like conductive particles. Resistance of the polymer layer shows a steep increase (or decrease) at the neighborhood of a temperature several degrees below melting point of the polymer material, because of a change in the gap between the conductive particles caused by thermal expansion (or shrinkage) of the polymer. Because of the above characteristic, the resistance of PTC thermistor 15 with leads, which is formed of the polymer PTC layer 16, electrode layers 17 and lead terminals 18, exhibits a remarkable increase in a temperature environment above the melting point of the polymer; it goes up to a far higher value (approximately 10000 times) than that in normal temperature. The resistance of thermistor 15 returns to the initial level when the temperature is lowered to normal temperature. Thus it can be used as a circuit protection component. Due to the hysteresis characteristic, the resistance returns to a level that is higher than the initial value (approximately 1.5 times that the initial value). The higher value does not bring about any material difficulties in normal practice. However, in a case where the resistance after restoration can not be neglected as the inner resistance of a circuit, it can be lowered to the initial level by leaving the thermistor in a temperature environment lower than melting point of the polymer by 30° C.–60° C., or leaving in an environment where the temperature moderately shifts between the above temperature and normal temperature. By so doing, the resistance can be restored to the initial level. Such process aimed to restore the resistance to the initial level is called annealing, and a phenomenon of reducing the plus-ward shift of resistance implemented by the thermal treatments is called annealing effect.

Thus, by taking advantage of the property that the resistance increases or decreases reversibly, it can control an overcurrent to a micro current; in such a way that an overcurrent causes a self heat generation, which raises the temperature to a level at which the resistance goes steeply up (hereinafter the temperature is referred to as protection-operation temperature). Once the power supply is cut off, temperature of the PTC thermistor goes low. By removing causes of the overcurrent, it can be used repeatedly. The terminology reversible property in the resistance of a PTC thermistor used here is defined to be including a property with which the resistance returns to the initial level by the annealing.

Now operation of a conventional battery pack is described. The circuit of battery pack 12 shown in FIG. 10A, FIG. 10B is formed of a battery cell 1 and a battery cell 4 connected in series by a PTC thermistor 7 with leads. The battery pack 12 is a battery unit whose negative terminal 3 and positive terminal 5 are connected to respective power supply terminals of an electronic apparatus through terminal holes 10 and 11. Suppose the battery cell 1 and the battery cell 4 are connected simply with a metal lead wire instead of the PTC thermistor 7 with leads, and there can be a possibility of short-circuit trouble arising in the power supply line of electronic apparatus. Or, even when the battery pack is not connected to an electronic apparatus, there can be a possibility that the positive terminal 5 and the negative terminal 3 are connected by chance with a metal or other high-conductive material. When such an inadvertent situation occurs, the battery cell 1 and the battery cell 4 generate heat by the overcurrent, then the inner pressure may destroy the battery cell itself. A PTC thermistor 7 with leads is a safety measure against such troubles. The operating principle of the safety measure is: the resistance of a PTC thermistor connected in series between the battery cells is raised sharply by the self-heat generation caused by an overcurrent, and the overcurrent is suppressed to a safe level low enough not destroying the battery (hereinafter referred to as overcurrent protection operation). When using a PTC thermistor as the overcurrent protection component, it needs to be selected properly taking into account the operating life of battery pack. At the same time, a thermistor should have a lowest possible resistance at the normal temperature, in view of less consumption in battery pack. A preferred value of the resistance is not higher than 40 mΩ, more preferably not higher than 20 mΩ.

The above-described configuration refers mainly to a basic structure of a battery pack used as primary cell. Recently, however, lithium ion battery and the like high performance secondary cells are being widely used in portable telephone units and the like apparatus. And, there are increasing needs for battery packs having a built-in protection circuit which controls charging/discharging. In the following, a conventional battery pack having a built-in protection circuit, and the method of manufacture are described referring to drawings.

FIG. 12 is a perspective view of a conventional battery pack with built-in protection circuit, which battery pack comprising a prismatic battery cell 25, a printed circuit board 28, a protection IC 29 mounted on a first mounting surface of the printed circuit board 28, and an FET (Field Effect Transistor) unit 30 consisting basically with two FETs. The prismatic battery cell 25 is provided with a positive terminal 26 which works also as the outer metal casing and a negative terminal 27 which is disposed on one surface alone among the surfaces of the prismatic battery cell 25. The printed circuit board 28 is provided with a positive lead out terminal 31 and a negative lead out terminal 32 on a second mounting surface that is opposite to the surface on which the protection IC 29 is mounted. A PTC thermistor 33 with leads is attached to the prismatic battery cell 25 so that part of it is in proximity to the two surfaces of battery cell. One lead 34 among the leads of the PTC thermistor 33 with leads is connected welded to the negative terminal 27, while the other lead 35 is connected with the printed circuit board 28. The positive lead out terminal 31 of battery pack and the positive terminal 26 which works also as the outer metal case are electrically connected by a connection lead 36.

Method for manufacturing the above-configured conventional battery pack with built-in protection circuit is described below. The printed circuit board 28 is printed on the second mounting surface with a cream solder by means of screen printing process. On the printed cream solder, the positive lead out terminal 31 and the negative lead out terminal 32 are attached and soldered thereon. And then, cream solder is applied on the first mounting surface of printed circuit board 28 by means of screen printing process. On the printed cream solder, the protection IC 29 and the FET unit 30 are attached, and these components are soldered on the printed circuit board 28 through a reflow soldering furnace. Meanwhile, the lead 34 of PTC thermistor 33 with leads is electric-welded on the negative terminal 27 of prismatic battery cell 25, and the connection lead 36 to the positive terminal 26. And then, the lead 35 of PTC thermistor 33 with leads which has been attached to the prismatic battery cell 25 is connected soldered on the soldered printed circuit board 28. Finally, the connection lead 36 is connected with solder on the printed circuit board 28 to provide a finished conventional battery pack having protection circuit.

Operation of the above-configured conventional battery pack having protection circuit is described referring to FIG, 13, a circuit block diagram which corresponds to the battery pack shown in FIG. 12.

The battery pack with protection circuit comprises a protection IC 29, an FET unit 30 formed of a first FET 37 and a second FET 38, and a PTC thermistor 33 with leads. This performs a control operation for protecting the prismatic battery cell 25 from the over charging and the over discharging, as well as a protection operation for protecting it from an overcurrent which might occur as a result of short-circuiting at load or at the protection circuit itself Typical operating principle is as follows: (a) Against over charging: As soon as voltage of the prismatic battery cell 25 reaches a certain specified value, gate of the second FET 38 is turned OFF (with the first FET 37 in ON state) to discontinue the charging current. (b) Against over discharging: When voltage of the prismatic battery cell 25 went low, gate of the first FET 37 is turned OFF (with the second FET 38 in ON state) to halt the discharge current. (c) Against short-circuiting at load: Shifts occurred in the ON resistance of FET unit 30 is detected to halt the short-circuit current. Or, the PTC thermistor 33 with leads, in its overcurrent protection operation, limits the current to a safe level. (d) Against short-circuiting within protection circuit: The PTC thermistor 33 with leads, in its overcurrent protection operation, limits the short-circuit current to a safe level.

As to the electrode-to-electrode contact, among other troubles, which could be brought about by an erroneous usage, a double- or triple-safety measure is to be provided. For a case in which the safety circuit failed to operate, a PTC thermistor 33 with leads is expected to play an important role of protection. Furthermore, by disposing a PTC thermistor 33 with leads in proximity to the prismatic battery cell 25, the resistance is raised through a direct heat conduction of a heat generated by the prismatic battery cell 25 itself. Thus it can move to a state of protection operation.

However, the above-described configuration requires during the manufacturing an assembling step of attaching a PTC thermistor 33 with leads to a battery cell and a printed circuit board. Furthermore, referring to FIGS. 11A and 11B, when a lead 18 is bent at a location close to the polymer PTC layer 16, a stress due to the bending work might cause a crack within the PTC thermistor 15 with leads, at some part between the polymer PTC layer 16 and the electrode layer 17. When the lead 18 is welded at a location close to the polymer PTC layer 16 with the electrode terminal of battery cell, the welding heat might cause a deterioration with the polymer PTC layer 16, resulting in an increased resistance of the PTC thermistor 15 with leads. Thus conventional battery packs have problems that there are fear of shortening operating time and deteriorating sensitivity in the operation.

These factors of resistance shift have a bad influence on the reversible property of a polymer PTC thermistor with respect to temperature, so these factors are to be considered as the deterioration in performance. If a lead 35 of PTC thermistor 33 with leads is soldered on a printed circuit board 28, as illustrated in FIG. 12, at a temperature higher than the melting point of polymer, the resistance increases to approximately 1.5 times plus-ward. If the heat treatment temperature is higher than 240° C., the resistance increases to approximately 2 to 3 times; so, the PTC thermistor can not keep the inner resistance (resistance at normal temperature) in a lower state. Thus the conventional battery pack has a problem that leads to a shorter operating time.

DISCLOSURE OF THE INVENTION

The present invention addresses the above problems of conventional technology, and aims to offer a battery pack having a longer operating time as well as a method for manufacturing the battery pack.

A battery pack in the present invention comprises a battery cell and a protection circuit unit for protecting the battery cell from the overcurrent or the high temperature. The protection circuit unit is an integrated body which contains a protection IC and a printed circuit board mounted with a surface-mount type PTC thermistor. In the present structure, a surface-mount type PTC thermistor used in the protection circuit unit contributes to a higher performance.

A method for manufacturing battery packs in accordance with the present invention comprises the steps of soldering a protection IC and a surface-mount type PTC thermistor on a printed circuit board, heat-treating the above soldered printed circuit board, connecting a connection lead to the respective positive electrode and negative electrode of battery cell, and electrically connecting the connection leads with the printed circuit board. In accordance with the present manufacturing method, the operating time can be improved by applying a heat treatment on a surface-mount type PTC thermistor soldered on printed circuit board.

BEST MODE FOR CARRYING OUT THE INVENTION

Figure 1:
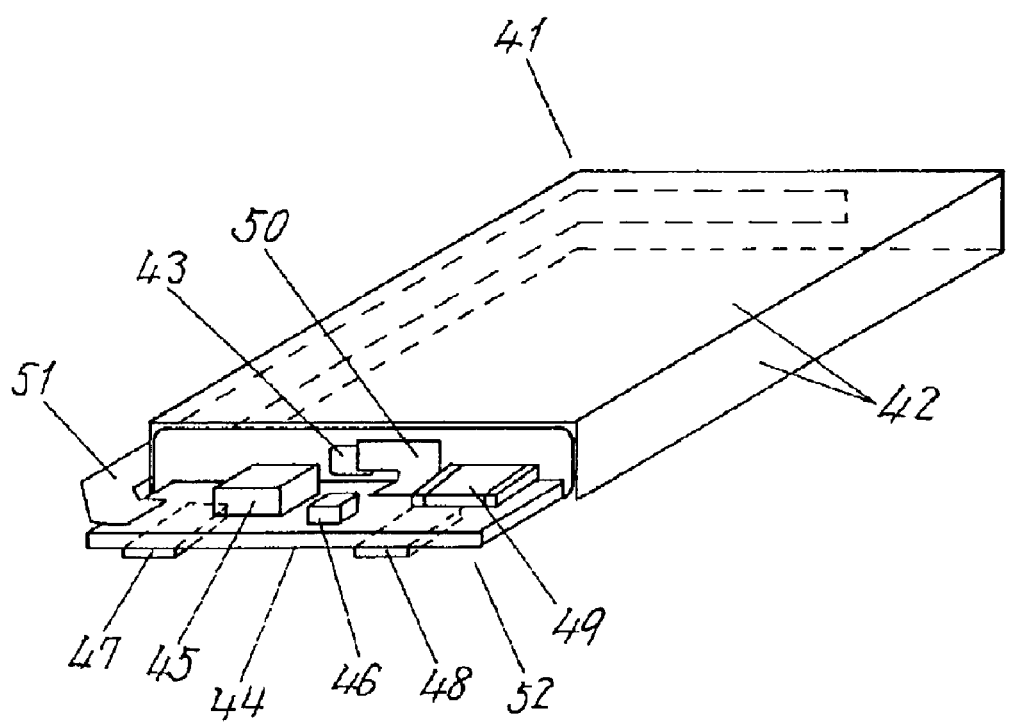
FIG. 1 is a perspective view of a battery pack in accordance with a first exemplary embodiment of the present invention.

Battery packs in accordance with exemplary embodiments of the present invention, and the manufacturing method are described referring to the drawings.

(Embodiment 1)

FIG. 1 is a perspective view of a battery pack in accordance with a first exemplary embodiment of the present invention. The battery pack comprises a prismatic battery cell 41 and a protection circuit unit 52. The protection circuit unit 52 comprises a printed circuit board 44 and a protection IC 45, a surface-mount type PTC thermistor 49 and an FET unit 46 which is formed basically of two FETs, mounted on a first mounting surface of the printed circuit board 44 using an SnAg system, or SnCu system, lead-free solder. The prismatic battery cell 41 is covered with a metal case, which case works also as the positive terminal 42, and the negative terminal 43 is disposed on only one surface among the surfaces of the prismatic battery cell 41. The printed circuit board 44 is provided on a second mounting surface, which is a surface opposite to the surface where the protection IC 45 is mounted, with the positive terminal 47 and the negative terminal 48 for leading respective electrodes of the battery pack out. The surface-mount type PTC thermistor 49 has outer dimensions approximately 4.5 mm×3.2 mm and 1 mm thick. It has a resistance 15 mΩ–20 mΩ before mounting, and the protection-operation temperature is within a range 110° C.–120° C. The surface-mount type thermistor 49 is disposed at a place close to the edge of printed circuit board 44 so that the thermistor is in proximity to the prismatic battery cell 41. The negative terminal 43 and the printed circuit board 44 are connected with a negative terminal connection lead 50. The positive terminal 47 for leading out the battery pack and the positive terminal-cum-outer metal case 42 are connected with a positive terminal connection lead 51 via print board 44.

A method for manufacturing the above-configured battery pack is described below. The printed circuit board 44 is printed on the second mounting surface with a cream solder by means of screen printing process. The positive lead out terminal 47 and the negative lead out terminal 48 are disposed on the printed cream solder, and soldered thereon. And then, the printed circuit board 44 is printed on the first mounting surface with a cream solder by means of screen printing process. Protection IC 45, FET unit 46 and surface-mount type PTC thermistor 49 are disposed on the printed cream solder. These components are soldered on the printed circuit board 44 through a reflow soldering furnace with a profile of peak temperature 250° C. Next, the printed circuit board 44 mounted with surface-mount type PTC thermistor 49 whose resistance has been raised to approximately 40 mΩ as the result of soldering is placed in an ambient temperature of 80° C. to be left there for about 30 min. Within several minutes afterwards, the ambient temperature is switched to 25° C. and left there for approximately 30 min. The temperature cycle is repeated for three times to have the resistance restored to 20 mΩ or lower (the process is referred to as annealing process). It is preferred to repeat the temperature cycle for five times.

On the other hand, the negative terminal 43 of prismatic battery cell 41 is electric-welded with negative electrode connection lead 50, and the positive terminal 42 with positive electrode connection lead 51. And then, the negative electrode connection lead 50 attached to prismatic battery cell 41 is connected by soldering on the annealed printed circuit board 44. Finally, the printed circuit board 44 and the positive electrode connection lead 51 are connected together by soldering.

In the battery pack thus configured and manufactured, the protection circuit unit 52 performs a control operation for protecting the prismatic battery cell 41 from the over charging and the over discharging, and a protection operation for protecting it from the possible overcurrent caused by a short-circuiting at load or a short-circuiting within the protection circuit itself.

As described in the above, the surface-mount type PTC thermistor 49 in the present embodiment 1 is mounted on the printed circuit board 44 in the same way as the protection IC 45 and the FET unit 46, and these components are soldered thereon by means of reflow soldering or the like soldering process. As compared to a PTC thermistor with leads, the surface-mount type PTC thermistor 49 does not need to bend the leads and electric-weld them with the negative terminal 43 of prismatic battery cell 41 and the printed circuit board 44 in order to form a circuit. Therefore, the resistance shift which could be caused by the bending stress or the thermal stress of electric-welding can be eliminated In the present embodiment 1, it is manufactured through the steps of soldering a surface-mount type PTC thermistor 49 on the printed circuit board 44, annealing the printed circuit board 44 mounted and soldered with surface-mount type PTC thermistor 49, electric-welding the positive terminal 42 and the negative terminal 43 of prismatic battery cell 41 with the positive electrode connection lead 51 and the negative electrode connection lead 50 respectively, and soldering the positive electrode connection lead 51 and the negative electrode connection lead 50 on the printed circuit board 44. It is possible that the resistance of a surface-mount type thermistor 48, which has been soldered on printed circuit board 44 with a lead-free solder of SnAg alloy, or SnCu alloy, whose melting point is 200° C. or higher, is raised to approximately double the value before soldering, or to approximately 40 mΩ. However, the increased resistance of soldered thermistor 49 can be lowered by annealing to 20 mΩ or less within a short period of time.

The surface-mount type PTC thermistor 49 in the present embodiment 1 does not require a process of bending and electric-welding the lead, which process is indispensable in the case using a PTC thermistor with leads. The surface-mount type PTC thermistor 49 can be mounted on the printed circuit board 44 in the same manner as the protection IC 45 and FET unit 46 using a mounting facility, and soldered. Thus the cost needed for the processing can be saved.

In the present embodiment 1, a surface along the thickness direction of the printed circuit board 44 is disposed to be close to the surface of negative terminal 43 of prismatic battery cell 41 so that a surface-mount type PTC thermistor 49 is disposed in proximity to the prismatic battery cell 41 at a place close to the edge of printed circuit board 44. Thus the surface-mount type PTC thermistor 49 and the prismatic battery cell 41 are in a thermally coupled state. So, it can move to the state of protection operation by the direct heat conduction from prismatic battery cell 41.

A surface molding type PTC thermistor 49 in the present embodiment 1 is electrically connected with the negative terminal 43 whose thermal capacitance is smaller among the positive and negative terminals of the prismatic battery cell 41, and disposed close to the negative terminal 43. Temperature of the negative terminal 43 having the smaller thermal capacitance is raised faster by the heat generated by prismatic battery cell 41. Therefore, the surface-mount type PTC thermistor 49 can get the heat quicker.

The annealing process in the present embodiment 1 is applied just after a surface-mount type PTC thermistor is mounted on printed circuit board. However, the annealing may be made instead after the mounted printed circuit board is connected soldered with the prismatic battery cell by means of a connection lead. The resistance can be likewise lowered.

Each of the positive electrode connection lead and the negative electrode connection lead in the present embodiment 1 is first electric-welded to the prismatic battery cell and then soldered on the printed circuit board. These leads, however, may be first soldered on the printed circuit board and then electric-welded to the prismatic battery cell.

The annealing in the present embodiment 1 is conducted in a profile where the highest temperature is 80° C., the lowest temperature is 25° C., and the leaving time for approximately 30 min. However, any temperature may be selected instead for these temperature levels, within a range not higher than 110° C., or the operating temperature of surface-mount type PTC thermistor, not lower than −40° C. The leaving time may also be extended to as long as approximately 12 hours, unless difficulty arises in the manufacturing process. The resistance which has been raised by the soldering can be lowered also by leaving it for a long time, longer than several hours, at a constant temperature within a range between 60° C. and 110° C.

The solder used for mounting on the printed circuit board in the present embodiment 1 is a lead-free solder of SnAg alloy or SnCu alloy. Other lead-free solders or a conventional SnPb alloy solder may be used instead for the purpose.

(Embodiment 2)

A battery pack in accordance with a second exemplary embodiment of the present invention, and the manufacturing method are described referring to the drawings.

Figure 2:
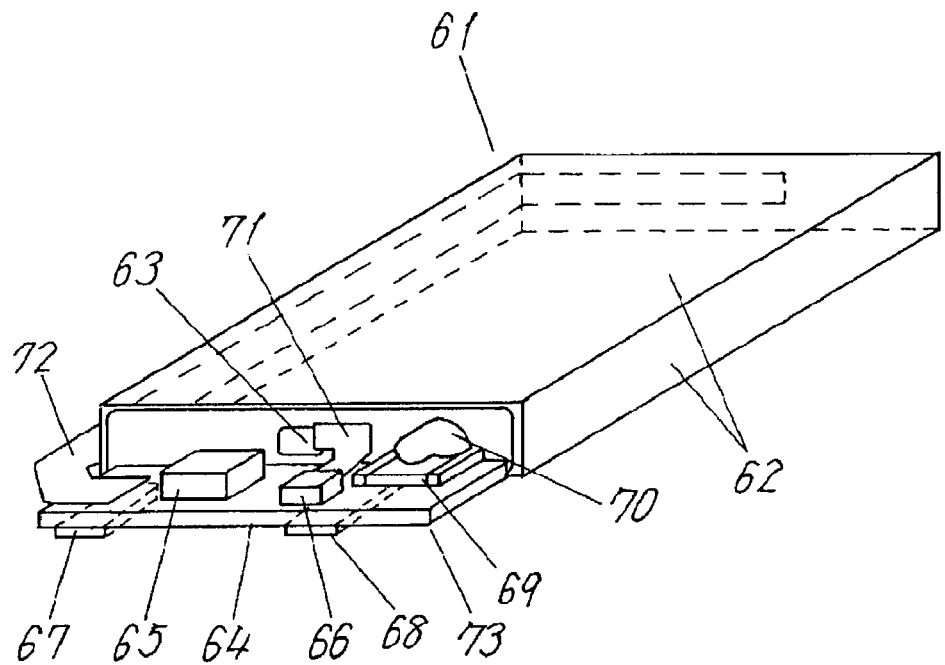
FIG. 2 is a perspective view of a battery pack in accordance with a second exemplary embodiment of the present invention.

FIG. 2 is a perspective view of a battery pack in accordance with a second exemplary embodiment of the present invention. The battery pack comprises a prismatic battery cell 61 and a protection circuit unit 73. The protection circuit unit 73 comprises a printed circuit board 64 and a protection IC, a surface-mount type PTC thermistor 69 and an FET unit 66 which is formed basically of two FETs, mounted on the first surface of printed circuit board 64, and soldered thereon using an SnAg alloy, or SnCu alloy, lead-free solder. The prismatic battery cell 61 is covered with a metal case, which works also as the positive terminal 62, and the negative terminal 63 is disposed on only one surface among the surfaces of the prismatic battery cell 61. The printed circuit board 64 is provided on a second mounting surface, which surface is opposite to the surface where the protection IC 65 is mounted, with the positive terminal 67 and the negative terminal 68 for leading respective terminals of the battery pack out. The surface-mount type PTC thermistor 69 has the outer dimensions approximately 4.5 mm×3.2 mm and 1 mm thick. It has a resistance 15 mΩ–20 mΩ before mounting, and the protection-operation temperature is within a range 110° C.–120° C. The surface-mount type thermistor 69 is disposed at a place close to the edge of printed circuit board 64 so that the thermistor is in proximity to the prismatic battery cell 61. The surface-mount type PTC thermistor 69, and the negative terminal 63 of prismatic battery cell 61 and the junction are glued with an epoxy resin 70 whose curing temperature is 100° C. The epoxy resin 70 is the point of difference from the structure in the embodiment 1. The negative terminal 63 and the printed circuit board 64 are connected with a negative terminal connection lead 71. The positive terminal 67 for leading out the battery pack and the positive terminal-cum-outer metal case 62 are connected by a positive terminal connection lead 72 via printed circuit board 64.

A method for manufacturing the above-configured battery pack is described below. The printed circuit board 64 is printed on the second mounting surface with a cream solder by means of screen printing process. The positive lead out terminal 67 and the negative lead out terminal 68 are disposed on the printed cream solder, and soldered thereon. The printed circuit board 64 is printed on the first mounting surface with a cream solder by means of screen printing process. Protection IC 65, FET unit 66 and surface-mount type PTC thermistor 69 are disposed on the printed cream solder. These components are soldered on the printed circuit board 64 through a reflow soldering furnace with a profile of peak temperature 250° C.

On the other hand, the negative terminal 63 of prismatic battery cell 61 is electric-welded with negative electrode connection lead 71, and the positive terminal 62 with the positive electrode connection lead 72. And then, the negative electrode connection lead 71 attached to prismatic battery cell 61 and the positive electrode connection lead 72 are soldered on the annealed printed circuit board 64. Finally, the an epoxy resin 70 is applied on the surface-mount type PTC thermistor 69, the negative terminal 63 of prismatic battery cell 61 and the junction, which is left in an ambient temperature of approximately 100° C. for 5 hours to be cured. Resistance of the surface-mount type PTC thermistor 69, which has been raised to approximately 40 mΩ as the result of soldering, is restored to 20 mΩ or lower by taking advantage of the above heat treatment for curing the epoxy resin.

In the battery pack thus configured and manufactured, the protection circuit unit 73 performs a control operation for protecting the prismatic battery cell 61 from the over charging and the over discharging, and a protection operation for protecting it from the overcurrent caused by a short-circuiting at load or a short-circuiting within the protection circuit itself.

In addition to the advantages implemented in the embodiment 1, the surface-mount type PTC thermistor 69 and the prismatic battery cell 61 are connected together with an epoxy resin 70, or heat conductive material, in the present embodiment 2. By so doing, the heat is efficiently conveyed to the surface-mount type PTC thermistor 69. Furthermore, a process for curing the epoxy resin and a heat treatment process for restoring the resistance of surface-mount type PTC thermistor 69 are conducted simultaneously.

In the present embodiment 2, an epoxy resin is used for the heat conducting member. However, phenol resin, silicone resin and other high polymer adhesive compound may be used instead for the purpose.

An epoxy resin is used for the heat conducting member in the present embodiment 2. However, a heat conduction at higher efficiency can be implemented by gluing the prismatic battery cell and the surface-mount type PTC thermistor with an epoxy resin using an aluminum plate, SUS plate or other metal plate as the intermediate member.

The heat treatment in the present embodiment 2 is utilized also for curing the epoxy resin. However, the printed circuit board mounted and soldered with a surface-mount type PTC thermistor may be annealed independently at a later step.

The solder used for mounting on the printed circuit board in the present embodiment 2 is a lead-free solder of SnAg alloy or SnCu alloy. Other lead-free solders or a conventional SnPb alloy solder may be used instead for the purpose.

(Embodiment 3)

A battery pack in accordance with a third exemplary embodiment of the present invention, and the manufacturing method are described referring to the drawings.

Figure 3:
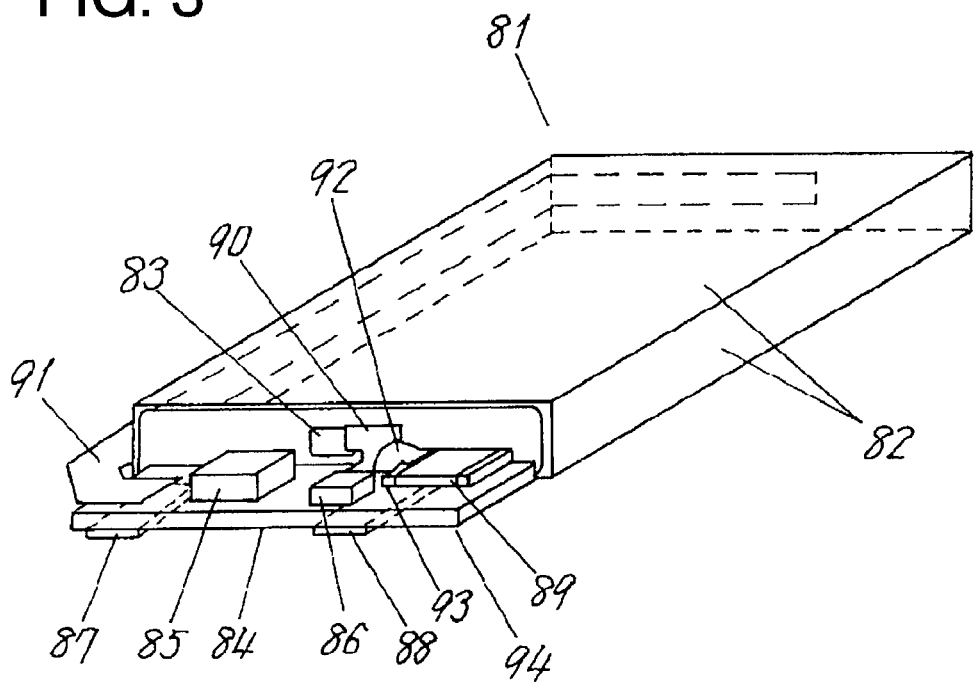
FIG. 3 is a perspective view of a battery pack in accordance with a third exemplary embodiment of the present invention.

FIG. 3 is a perspective view of a battery pack in accordance with a third exemplary embodiment of the present invention. The battery pack comprises a prismatic battery cell 81 and a protection circuit unit 94. The protection circuit unit 94 comprises a printed circuit board 84 and a protection IC, a surface-mount type PTC thermistor and an FET unit 86 which is formed basically of two FETs, mounted on the first surface of printed circuit board 84, and soldered thereon using an SnAg alloy, or SnCu alloy, lead-free solder. The prismatic battery cell 81 is covered with a metal case, which works also as the positive terminal 82, and the negative terminal 83 is disposed on only one surface among the surfaces of the prismatic battery cell. The printed circuit board 84 is provided on a second mounting surface, which is a surface opposite to the surface where the protection IC 85 is mounted, with the positive terminal 87 and the negative terminal 88 for leading respective terminals of the battery pack out. The surface-mount type PTC thermistor 89 has the outer dimensions approximately 4.5 mm×3.2 mm and 1 mm thick. It has a resistance 15 mΩ–20 mΩ before mounting, and the protection-operation temperature is within a range 110° C.–120° C. The surface-mount type thermistor 89 is disposed at a place close to the edge of printed circuit board 84 so that the thermistor is in proximity to the prismatic battery cell 81. The negative terminal 83 and the printed circuit board 84 are connected by a negative terminal connection lead 90. The positive terminal 87 for leading out the battery pack and the positive terminal-cum-outer metal case 82 are electrically connected by a positive terminal connection lead via the printed circuit board 84. A side terminal 93 of the surface-mount type PTC thermistor 89 and the negative terminal connection lead 90 are electrically connected with a lead-free solder 92 of SnAg alloy or SnCu alloy. The lead-free solder has the melting point 300° C. or lower; preferably lower than 260° C., more preferably lower than 240° C. The solder member 92 is the point of difference from the structure in embodiment 1.

A method for manufacturing the above-configured battery pack is described below. The printed circuit board 84 is printed on the second mounting surface with a cream solder by means of screen printing process. The positive lead out terminal 87 and the negative lead out terminal 88 are disposed on the printed cream solder, and soldered thereon. The printed circuit board 84 is printed on the first mounting surface with a cream solder by means of screen printing process. Protection IC 85, FET unit 86 and surface-mount type PTC thermistor 89 are disposed on the printed cream solder. These components are soldered on the printed circuit board 84 through a reflow soldering furnace with a profile of peak temperature 250° C. Next, a positive terminal connection lead 91 is soldered on the printed circuit board 84. The negative terminal connection lead 90 is connected to the printed circuit board 84 and the side terminal 93 of surface-mount type PTC thermistor 89 by means of the solder member 92. And then, the negative terminal connection lead 90 is electric-welded to the negative terminal 83 of prismatic battery cell 81, and the positive terminal connection lead 91 to the positive terminal 82. Finally, the surface-mount type PTC thermistor 89 whose resistance has been raised to approximately 40 mΩ–50 mΩ as the result of soldering to the printed circuit board 84 and connection with the solder member 92 is placed in an ambient temperature of 80° C. to be left there for approximately 30 min. Within several minutes afterwards, the ambient temperature is switched to 25° C. to be left there for approximately 30 min. The temperature cycle is repeated for five times preferably ten times) for annealing, to have the resistance restored to 20 mΩ or lower.

In the battery pack thus configured and manufactured, the protection circuit unit 94 performs a control operation for protecting the prismatic battery cell 81 from the over charging and the over discharging, and a protection operation for protecting it from the overcurrent caused by a short-circuiting at load or a short-circuiting within the protection circuit itself.

In addition to the advantages implemented in the embodiment 1, the side terminal 93 of surface-mount type PTC thermistor 89 and the negative terminal connection lead 90 in the present embodiment 3 are electrically connected with a solder member 92 having a melting point 300° C. or lower. By so doing, the heat generated by prismatic battery cell 81 is conducted to the surface-mount type PTC thermistor 89 via the solder member 92. Furthermore, resistance of the surface-mount type PYC thermistor 89 which has been raised as the result of connection of the solder member 92 can be restored by an annealing process.

The solder used in the present embodiment 3 is a lead-free solder of SnAg alloy or SnCu alloy. Other lead-free solder members selected among the group of Sn, Bi, Ag, Cu, Zn, In, Au, etc., or a conventional SnPb alloy solder member may be used instead for the purpose.

(Embodiment 4)

Figure 4:
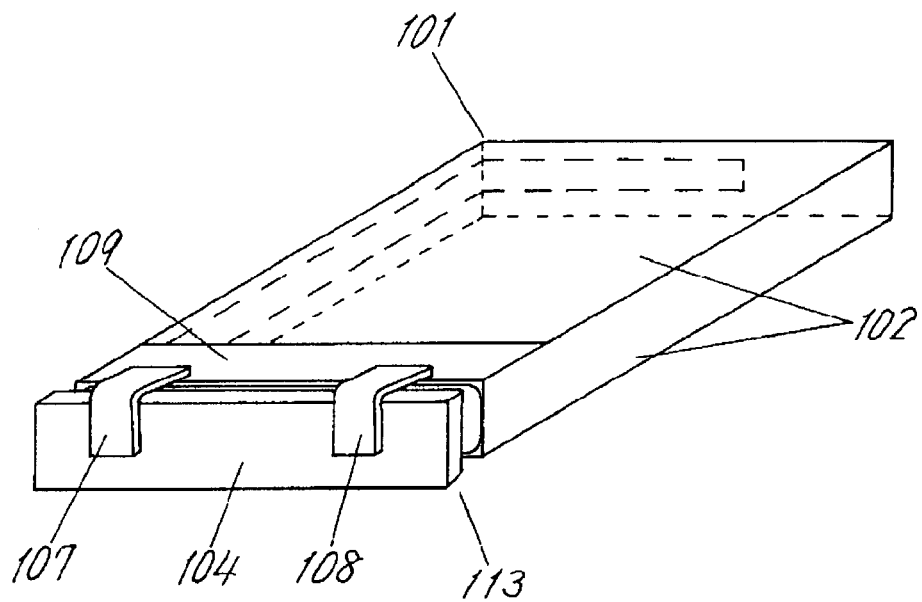
FIG. 4 is a perspective view of a battery pack in accordance with a fourth exemplary embodiment of the present invention.
Figure 5:
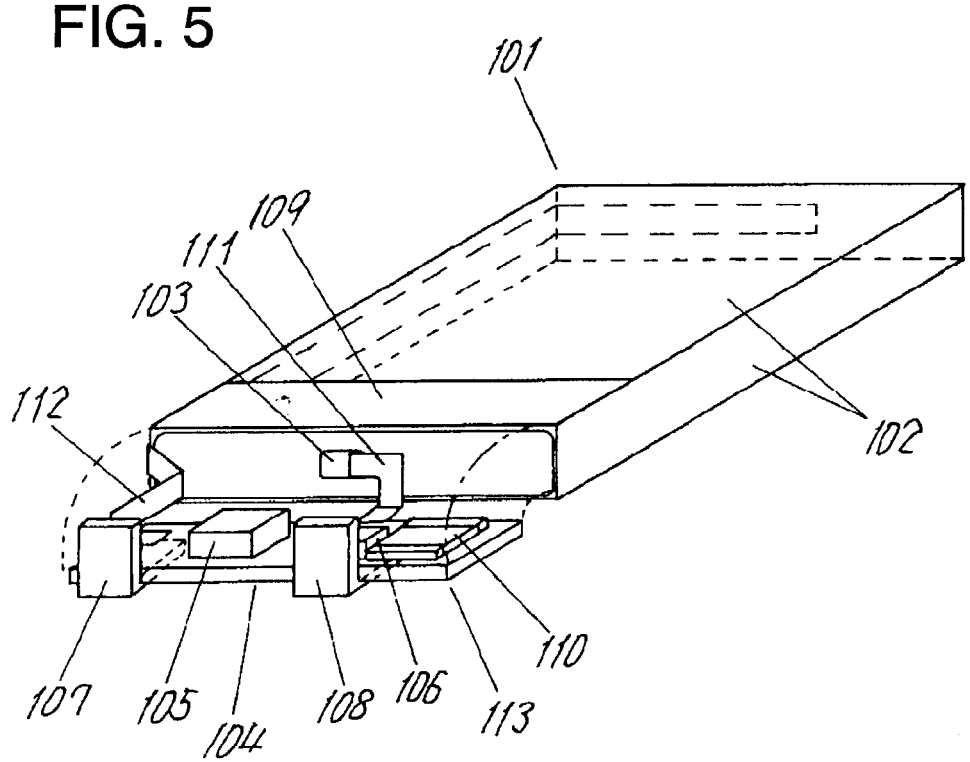
FIG. 5 shows unfolded view of the battery pack.

A battery pack in accordance with a fourth exemplary embodiment of the present invention, and the manufacturing method are described referring to the drawings. FIG. 4 is a perspective view of a battery pack in accordance with a fourth exemplary embodiment of the present invention. FIG. 5 is the unfolded view of the one shown in FIG. 4. The battery pack comprises a prismatic battery cell 101 and a protection circuit unit 113. The protection circuit unit 113 comprises a printed circuit board 104 and a protection IC, a surface-mount type PTC thermistor 110 and an FET unit 106 which is formed basically of two FETs, mounted on the first mounting surface of printed circuit board 104 using an SnAg alloy, or SnCu alloy, lead-free solder. The prismatic battery cell 101 is covered with a metal case, which works also as the positive terminal 102, and the negative terminal 103 is disposed on only one surface among the surfaces of the prismatic battery cell. The positive terminal 107 and the negative terminal 108 for leading out respective terminals of the battery pack are provided on a second mounting surface of the printed circuit board 104, which surface is opposite to the surface where the protection IC 105 is mounted. The printed circuit board 104 is disposed so that the first mounting surface opposes to the surface containing the negative terminal 103. Terminals 107 and 108, which are extruding from the printed circuit board 104 and bent, are attached at their bent ends in proximity to the upper surface of the positive terminal 102 of prismatic battery cell 101, via an insulating sheet 109. The surface-mount type PTC thermistor 110 has the outer dimensions approximately 4.5 mm×3.2 mm and 1 mm thick. It has a resistance 15 mΩ–20 mΩ before mounting, and the protection-operation temperature is within a range 110° C.–120° C. The surface mounted with the surface-mount type thermistor 110 opposes close to the surface containing the negative terminal 103 of the prismatic battery cell 101. The negative terminal 103 and the printed circuit board 104 are connected by a negative terminal connection lead 111. The positive terminal 107 for leading out the battery pack and the positive terminal-cum-outer metal case 102 are electrically connected by a positive terminal connection lead 112 via the printed circuit board 104.

A method for manufacturing the above-configured battery pack is described below. The printed circuit board 104 is printed on the first mounting surface with a cream solder by means of screen printing process. The protection IC 105, FET unit 106 and surface-mount type PTC thermistor 110 are disposed on the printed cream solder. The printed circuit board 104 and the components are soldered through a reflow soldering furnace with a profile of peak temperature 250° C. On the other hand, a negative terminal connection lead 111 is electric-welded to the negative terminal 103 of prismatic battery cell 101, and a positive terminal connection lead 112 to the positive terminal 102. The negative terminal connection lead 111 and the positive terminal connection lead 112 are soldered on the printed circuit board 104. Next, the negative terminal connection lead 111 and the positive terminal connection lead 112 are folded so that the first mounting surface of printed circuit board 104 opposes to the surface of prismatic battery cell 101, which surface containing the negative terminal 103. The positive lead out terminal 107 and the negative lead out terminal 108, both having been bent for approximately 90 degrees, are soldered respectively on the second mounting surface of printed circuit board 104 so that each of them makes contact on both the insulating sheet 109 attached on the surface of prismatic battery cell 101 and the second mounting surface of printed circuit board 104. Finally, the printed circuit board 104 mounted with the surface-mount type PTC thermistor 110, whose resistance has been raised to approximately 40 mΩ as the result of soldering to printed circuit board 84, is placed in an ambient of 80° C. together with the prismatic battery cell 101, and left there for approximately 30 min. Within several minutes afterwards, the ambient temperature is switched to 25° C. to be left there for approximately 30 min. The temperature cycle is repeated for three times (preferably five times) for annealing. Thus the resistance is restored to 20 mΩ or lower.

In the battery pack thus configured and manufactured, the protection circuit unit 113 performs a control operation for protecting the prismatic battery cell 101 from the over charging and the over discharging, and a protection operation for protecting it from the overcurrent caused by a short-circuiting at load or a short-circuiting within the protection circuit itself.

As described in the above, the surface-mount type PTC thermistor 110 in the present embodiment 4 is mounted on the printed circuit board 104 in the same way as the protection IC 105 and the FET unit 106 by means of reflow soldering or the like soldering process. As compared to a PTC thermistor with leads, the surface-mount type PTC thermistor 110 does not need to bend the leads and electric-weld them with the negative terminal 103 of prismatic battery cell 101 and the printed circuit board 104 in order to form a circuit. Therefore, the resistance shift which could be caused by the bending stress or the thermal stress of electric-welding can be eliminated.

In the present embodiment 4, it is manufactured through the steps of soldering a surface-mount type PTC thermistor 110 on the printed circuit board 104, electric-welding a positive terminal connection lead 112 and a negative terminal connection lead 111 respectively to the positive terminal 102 and the negative terminal 103 of the prismatic battery cell 101, soldering the positive terminal connection lead 112 and the negative terminal connection lead 111 on the printed circuit board 104, and annealing the printed circuit board 104 mounted with the surface-mount type PTC thermistor 110 and the prismatic battery cell 101 at the same time. The resistance of surface-mount type PTC thermistor 110, which has been raised as the result of soldering with a lead-free solder of SnAg alloy, or SnCu alloy, having a melting point 200° C. or higher, to approximately double the value before mounting, or to approximately 40 mΩ, can be lowered to 20 mΩ or less by an annealing effect.

The mounting surface of printed circuit board 104 in the present embodiment 4 is opposed to the surface of negative terminal 103 of prismatic battery cell 101. The mounting surface of surface-mount type PTC thermistor 110 is opposed to the prismatic battery cell 101 in proximity to the surface containing the negative terminal 103. Namely, the main surface of surface-mount type PTC thermistor 110 is disposed in proximity to the prismatic battery cell 101, and the two are in a thermally coupled state. So, it can quickly move to a state of protection operation by direct heat conduction from the prismatic battery cell 101.

The mounting surface of printed circuit board 104 in the present embodiment 4 is opposed to the surface of prismatic battery cell 101 containing the negative terminal 103. The printed circuit board 104 is supported by the positive lead out terminal 107 and the negative lead out terminal 108, which have been attached to the printed circuit board 104 at a surface opposite to the surface on which the surface-mount type PTC thermistor 110 is mounted; thus the printed circuit board 104 is supported by the opposing prismatic battery cell 101. Namely, the positive lead out terminal 107 and the negative lead out terminal 108 are fixed in a stable condition, and a reliable contact with terminals of external electronic apparatus is ensured.

The positive lead out terminal 107 and the negative lead out terminal 108 in the present embodiment 4, which are extruding from the printed circuit board 104 and bent, are disposed at the bent end in proximity to the upper surface of positive terminal 102 of prismatic battery cell 101 with an insulating sheet 109 in between. Thus the positive lead out terminal 107 and the negative lead out terminal 108 are firmly supported and fixed direct on the prismatic battery cell 101 by the upper surface, not via printed circuit board 104. The printed circuit board 104 can be kept free from a mechanical stress, when connection of the lead out terminals with terminals of external electronic apparatus is arranged so that the contact takes place at the firmly supported upper surface of the lead out terminals.

The protection IC and the FET unit in the present embodiment 4 are mounted on the same mounting surface of printed circuit board where the surface-mount type PTC is mounted. However, the protection IC and FET unit may be mounted instead on the opposite surface of printed circuit board, namely on the same surface where the positive lead out terminal and the negative lead out terminal are attached.

The annealing temperatures in the present embodiment 4 are specified to be 80° C. for the highest temperature and 25° C. for the lowest temperature, and the leaving time approximately 30 min. However, the temperatures may take any values within a temperature range not higher than 110° C., which is the operating temperature of surface-mount type PTC thermistor, not lower than −40° C. The time for leaving may also be extended to approximately 12 hours, unless difficulty arises in manufacturing procedures. Besides the above-described annealing arrangements, the resistance raised by the soldering can be lowered by leaving it for a long time, longer than several hours, in a constant temperature within a range between 60° C. and 110° C.

The solder used for mounting components on the printed circuit board in the present embodiment 4 is a lead-free solder of SnAg alloy or SnCu alloy. However, other lead-free solders or a conventional SnPb system solder may be used instead for the purpose. Furthermore, since the surface-mount type PTC thermistor 110 and the prismatic battery cell 101 are disposed opposing to each other, as shown in FIG. 4, the surface-mount type PTC thermistor 110 readily receives the heat radiated from prismatic battery cell 101. Thus the two are thermally coupled in a highly efficient manner.

(Embodiment 5)

Figure 6:
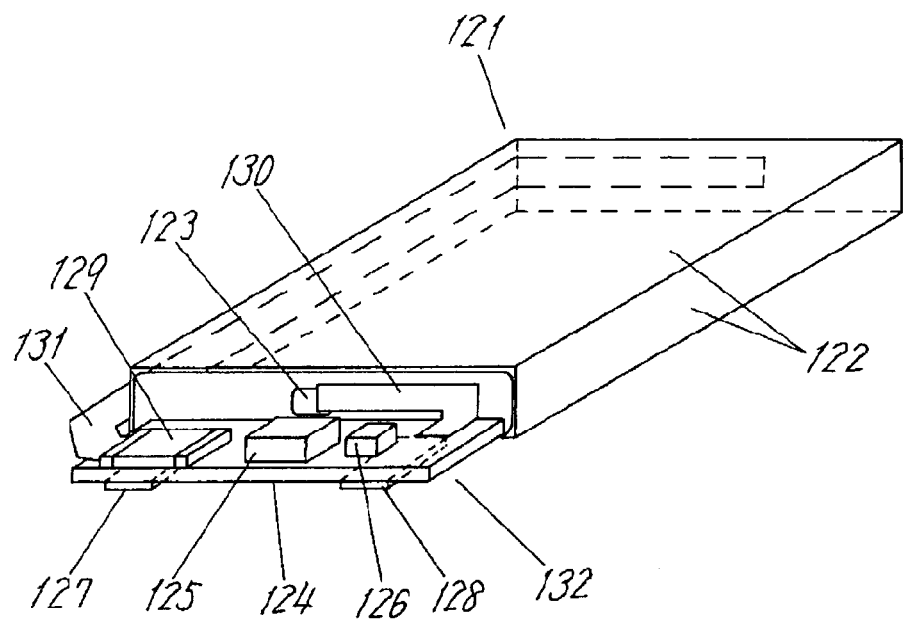
FIG. 6 is a perspective view of a battery pack in accordance with a fifth exemplary embodiment of the present invention.

A battery pack in accordance with a fifth exemplary embodiment of the present invention, and the manufacturing method are described referring to the drawings. FIG. 6 is a perspective view of a battery pack in accordance with a fifth exemplary embodiment of the present invention. The battery pack comprises a prismatic battery cell 121 and a protection circuit unit 132. The protection circuit unit 132 comprises a printed circuit board 124, a protection IC 125, a surface-mount type PTC thermistor 129 and an FET unit 126 which is formed basically of two FETs, mounted on a first mounting surface of the printed circuit board 124 using an SnAg alloy, or SnCu alloy, lead-free solder. The printed circuit board 124 is provided on a second mounting surface, which surface is a surface opposite to the surface where the protection IC 125 is mounted, with the positive terminal 127 and the negative terminal 128 for leading respective terminals of the battery pack out. The surface-mount type thermistor 129 is mounted on the first mounting surface of printed circuit board 124 using an SnAg alloy, or SnCu alloy, lead-free solder. The surface-mount type thermistor 129 is disposed at the other side of the FET unit 126 with the protection IC 125 in the middle, keeping a space between each other. The surface-mount type thermistor 129 is located at a place close to the edge of printed circuit board 124 in proximity to the prismatic battery cell 121. Furthermore, the surface-mount type thermistor 129 is electrically connected with the positive lead out terminal 127 via printed circuit board 124. The negative terminal 123 and the printed circuit board 124 are connected by a negative terminal connection lead 130. The surface-mount type thermistor 129 and the outer metal case which also works as a positive terminal 122 are electrically connected by a positive terminal connection lead 131 via printed circuit board 124.

A method for manufacturing the above-configured battery pack is described below. The printed circuit board 124 is printed on the second mounting surface with a cream solder by means of screen printing process. A positive lead out terminal 127 and a negative lead out terminal 128 are disposed on the printed cream solder, and soldered thereon. The printed circuit board 124 is printed on the first mounting surface with a cream solder by means of screen printing process. Protection IC 125, FET unit 126 and surface-mount type PTC thermistor 129 are disposed on the printed cream solder. The printed circuit board 124 and these components are soldered through a reflow soldering furnace with a profile of peak temperature 250° C. Next, the printed circuit board 124 mounted with the surface-mount type PTC thermistor 129, whose resistance has been raised to approximately 40 mΩ as the result of soldering, is placed in an ambient temperature of 80° C. to be left there for about 30 min. Within several minutes afterwards, the ambient temperature is switched to 25° C. to be left there for approximately 30 min. The temperature cycle is repeated for three times (preferably five times) for annealing. The resistance is restored to 20 mΩ or lower.

On the other hand, a negative terminal connection lead 130 is electric-welded to the negative terminal 123 of prismatic battery cell 121, and a positive terminal connection lead 131 to the positive terminal 122. Then, the negative terminal connection lead 130 attached to the prismatic battery cell 121 is soldered on annealed printed circuit board 124. Finally, the positive terminal connection lead 131 is soldered on the printed circuit board 124.

In the battery pack thus configured and manufactured, the protection circuit unit 132 performs a control operation for protecting the prismatic battery cell 121 from the over charging and the over discharging, and a protection operation for protecting it from the overcurrent caused by a short-circuiting at load or a short-circuiting within the protection circuit itself.

As described in the above, the surface-mount type PTC thermistor 129 in the present embodiment 5 is mounted and soldered on the printed circuit board 124 in the same way as the protection IC 125 and the FET unit 126 by means of reflow soldering or the like soldering process. As compared to the PTC thermistor with leads, the surface-mount type PTC thermistor 129 does not require bending and electric-welding of lead terminals for forming a circuit. Therefore, the resistance shift caused by bending stress or thermal stress due to electric-welding can be eliminated.

In the present embodiment 5, it is manufactured through the steps of soldering a surface-mount type PTC thermistor 129 on the printed circuit board 124, annealing the printed circuit board 124 mounted and soldered with the surface-mount type PTC thermistor 129, electric-welding a positive terminal connection lead 131 and a negative terminal connection lead 130 respectively to the positive terminal 122 and the negative terminal 123 of the prismatic battery cell 121, and soldering the positive terminal connection lead 131 and the negative terminal connection lead 130 on the printed circuit board 124. The resistance of surface-mount type PTC thermistor 129, which has been increased to approximately double the value at normal temperature, or to approximately 40 mΩ, as the result of soldering with a lead-free solder of SnAg alloy, or SnCu alloy, whose melting point is 200° C. or higher, can be reduced to 20 mΩ or lower by an annealing effect.

The surface-mount type PTC thermistor 129 in the present embodiment 5 is electrically connected with the outer metal case which works as a positive terminal 122 of prismatic battery cell 121 having a large thermal capacitance, and disposed at a place close to edge of the printed circuit board 124 locating in the neighbor of prismatic battery cell 121. Temperature rise due to heat generation of prismatic battery cell 121 is relatively slow with the positive terminal 122. The surface-mount type PTC thermistor 129 is affected less by the heat generated from prismatic battery cell 121, because of a clearance existing between the two. Therefore, the surfacemount type PTC thermistor 129 operates mainly on the self heat generation due to overcurrent, for implementing a protection operation. Namely, the present embodiment 5 is suitable for such applications where the priority is on the protection from overcurrent. The same effects can be expected by mounting the surface-mount type PTC thermistor 129 on the printed circuit board 124 at the opposite surface, where it does not oppose to the prismatic battery cell 121; because the heat transfer by radiation and/or convection from prismatic battery cell 121 is reduced. Besides the above-described configuration, the heat transfer can be reduced by providing heat shielding means between the surface-mount type PTC thermistor 129 and the prismatic battery cell 121. In a case where a battery pack is compelled by some reason to adopt the structure shown in FIG. 4, a heat shielding means provided between PTC thermistor 129 and prismatic battery cell 121 is an effective solution.

Surface-mount type PTC thermistor in the present embodiment 5 is mounted on the same surface as the FET unit. However, each of the two components may be disposed on a different surface of a printed circuit board for the purpose of making the mutual thermal influence smaller.

The solder used for mounting on the printed circuit board in the present embodiment 5 is a lead-free solder of SnAg alloy or SnCu alloy Other lead-free solders or a conventional SnPb alloy solder may be used instead for the purpose.

(Embodiment 6)

A battery pack in accordance with a sixth exemplary embodiment of the present invention is described referring to the drawings.

Figure 7:
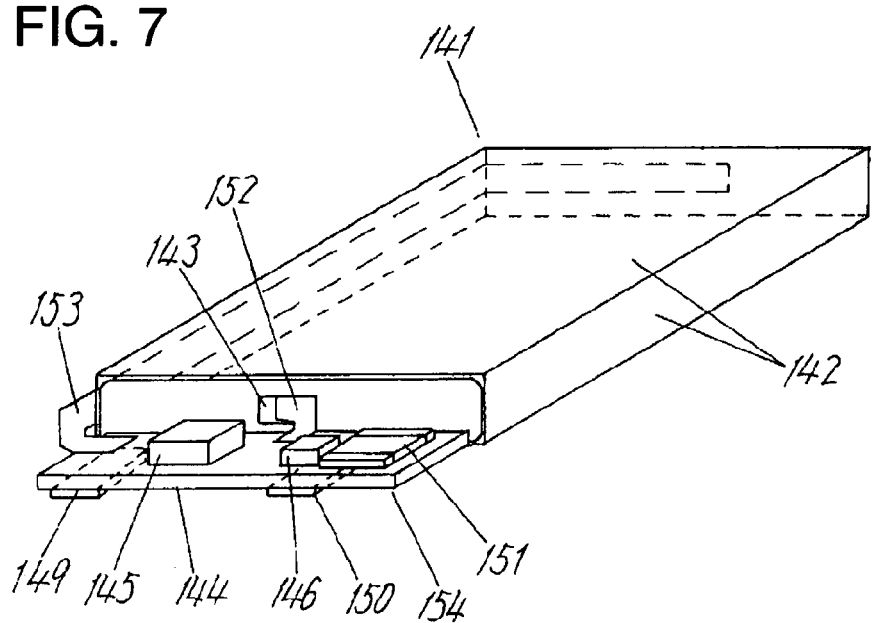
FIG. 7 is a perspective view of a battery pack in accordance with a sixth exemplary embodiment of the present invention.
Figure 8:
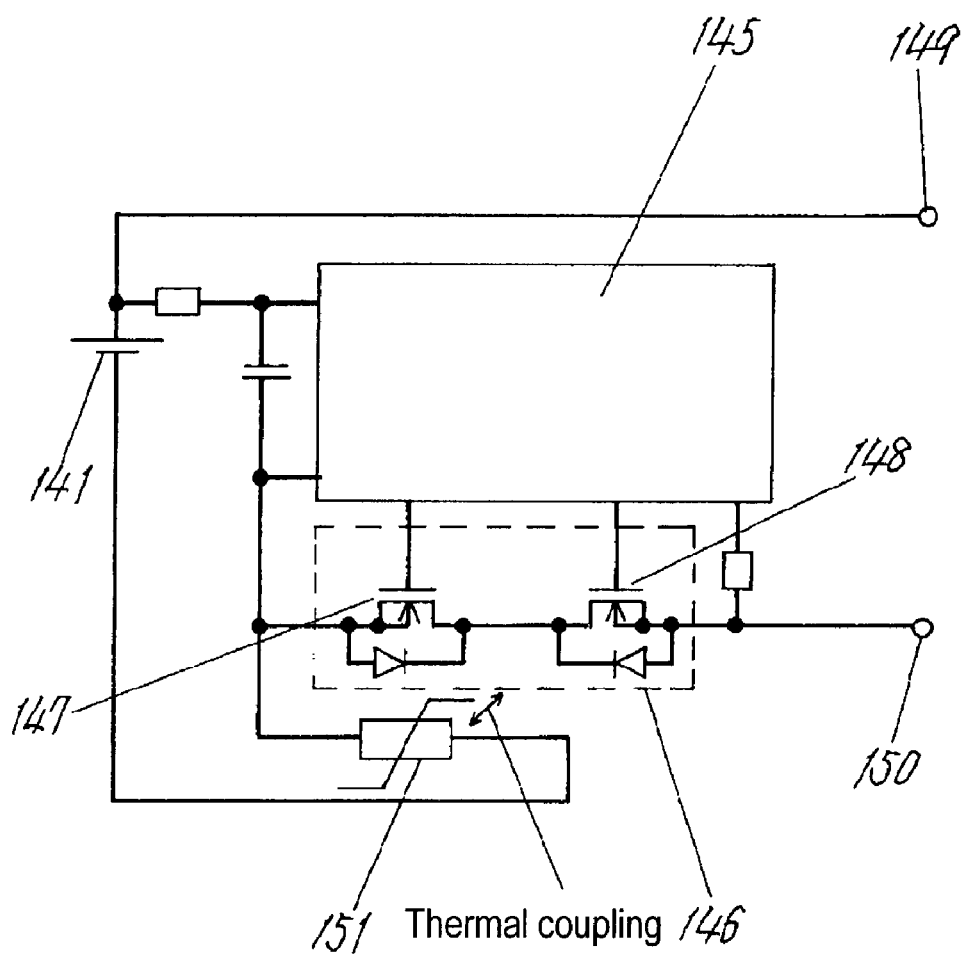
FIG. 8 shows the circuit block diagram.

FIG. 7 is a perspective view of a battery pack in accordance with a sixth exemplary embodiment of the present invention. FIG. 8 is the circuit block diagram of the one shown in FIG. 7. The battery pack comprise a prismatic battery cell 141 and a protection circuit unit 154. The protection circuit unit 154 comprises a printed circuit board 144, a protection IC 145, an FET unit 146 and a surface-mount type PTC thermistor 151. The prismatic battery cell 141 is covered with a metal case which works also as the positive terminal 142, and the negative terminal 143 is disposed on only one surface among the surfaces of the prismatic battery cell 141. A surface along the thickness direction of the printed circuit board 144 is disposed close to a surface of prismatic battery cell 141 containing the negative terminal 143. The protection IC, FET unit 146 which is formed basically of two FETs, viz. FET 147 and FET 148, and surface-mount type PTC thermistor 151 are mounted soldered on the first mounting surface of printed circuit board 144. The printed circuit board 144 is provided on the second mounting surface, which surface is a surface opposite to the surface on which the protection IC 145 is mounted, with the positive terminal 149 and the negative terminal 150 for leading respective terminals of the battery pack out. The surface-mount type PTC thermistor 151 is electrically connected with the FET 147. The surface-mount type PTC thermistor 151 and the FET unit 146 are located close to each other with a gap not less than 0.1 mm not more than 0.5 mm in between. The negative terminal 143 and the printed circuit board 144 are connected by a negative terminal connection lead 152. The positive terminal 149 for leading out the battery pack 141 and the outer metal case which also works as a positive terminal 142 are connected by a positive terminal connection lead 153 via the printed circuit board 144. The protection circuit unit 154 is formed of the printed circuit board 144, the protection IC 145, the FET unit 146 and the surface-mount type PTC thermistor 151.

A method for manufacturing the above-configured battery pack is described below. The printed circuit board 144 is printed on the second mounting surface with a cream solder by means of screen printing process. The positive lead out terminal 149 and the negative lead out terminal 150 are disposed on the printed cream solder, and soldered thereon. The printed circuit board 144 is printed on the first mounting surface with a cream solder by means of screen printing process. Protection IC 145, FET unit 146 and surface-mount type PTC thermistor 151 are disposed on the printed cream solder. The printed circuit board 144 and these components are soldered through a reflow soldering furnace with a profile of peak temperature 250° C. Next, the printed circuit board 144 mounted and soldered with the surface-mount type PTC thermistor 151, whose resistance has been raised to approximately 40 mΩ as the result of soldering, is placed in an ambient temperature 80° C. to be left there for approximately 30 min. Within several minutes afterwards, the ambient temperature is switched to 25° C., and it is left there for approximately 30 min. The temperature cycle is repeated for three times (preferably five times) for annealing. The resistance is restored to 20 mΩ or lower.

On the other hand, a negative terminal connection lead 152 is electric-welded to the negative terminal 143 of prismatic battery cell 141, and a positive terminal connection lead 153 to the positive terminal 142. The annealed printed circuit board 144 and the negative terminal connection lead 152 attached to prismatic battery cell 141 are soldered. Finally, the positive terminal connection lead 153 is soldered on the printed circuit board 144 to complete a finished battery pack.

In the battery pack thus configured and manufactured, the protection circuit unit 154 performs a control operation for protecting the prismatic battery cell 141 from the over charging and the over discharging, and a protection operation for protecting it from the overcurrent caused by a short-circuiting at load or a short-circuiting within the protection circuit itself.

As described in the above, the surface-mount type PTC thermistor 151 in the present embodiment 6 is mounted on the printed circuit board 144 in the same way as the protection IC 145 and the FET unit 146 by means of reflow soldering or the like soldering process. As compared to the PTC thermistor with leads, the surface-mount type PTC thermistor 151 does not require bending and electric-welding the lead terminals for forming a circuit. Therefore, the resistance shift caused by bending stress or thermal stress due to electric-welding can be eliminated.

In the present embodiment 6, it is manufactured through the steps of soldering a surface-mount type PTC thermistor 151 on the printed circuit board 144, annealing the printed circuit board 144 mounted and soldered with the surface-mount type PTC thermistor 151, electric-welding a positive terminal connection lead 153 and a negative terminal connection lead 152 respectively to the positive terminal 142 and the negative terminal 143 of the prismatic battery cell 141, and soldering the positive terminal connection lead 153 and the negative terminal connection lead 152 on the printed circuit board 144. The resistance of surface-mount type PTC thermistor 151, which has been raised to 40 mΩ as the result of soldering with a lead-free solder of SnAg alloy, or SnCu alloy, having a melting point 200° C. or higher, can be reduced to 20 mΩ or lower through an annealing effect.

The surface-mount type PTC thermistor 151 and the FET unit 146 in the present embodiment 6 are disposed close to each other with a gap not less than 0.1 mm not more than 0.5 mm in between. Under the above-described arrangement, the surface-mount type PTC thermistor 151 and the FET unit 146 are brought into a thermally coupled state, and the protection operation can be started also by a heat generated by the FET unit 146. By the electrical connection made between the surface-mount type PTC thermistor 151 and the FET 147, and the two components are thermally coupled via the wiring in printed circuit board.

Figure 9:
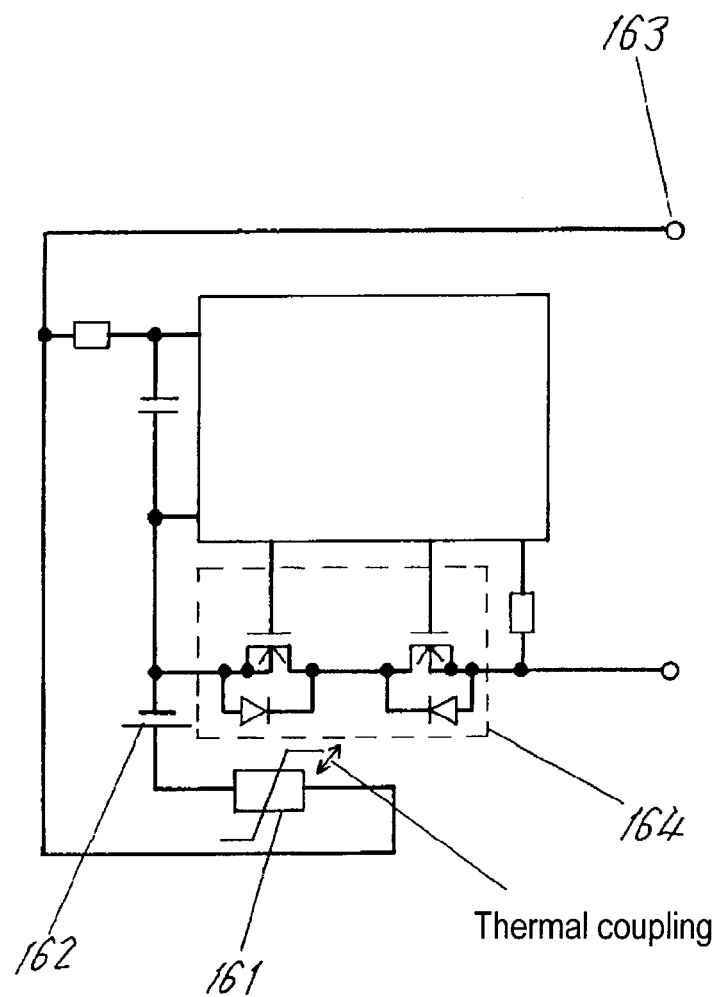
FIG. 9 is a circuit block diagram in other embodiment of the present invention.
Figure 10A:
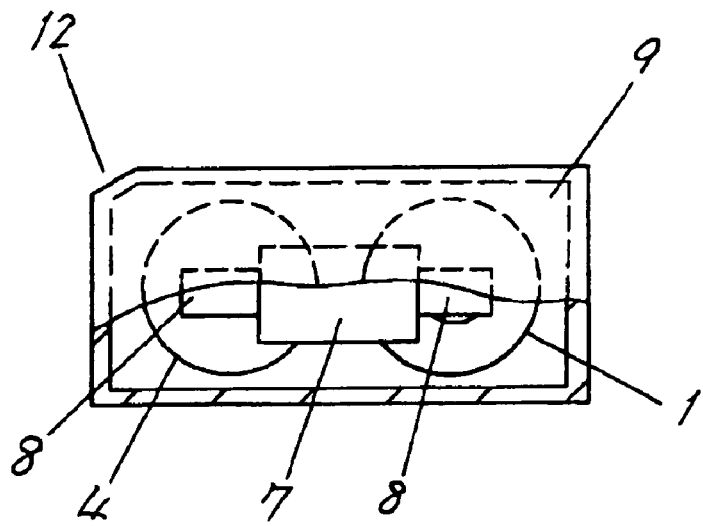
FIG. 10A is a top view of a conventional battery pack, where part of the case has been cut off.
Figure 10B:
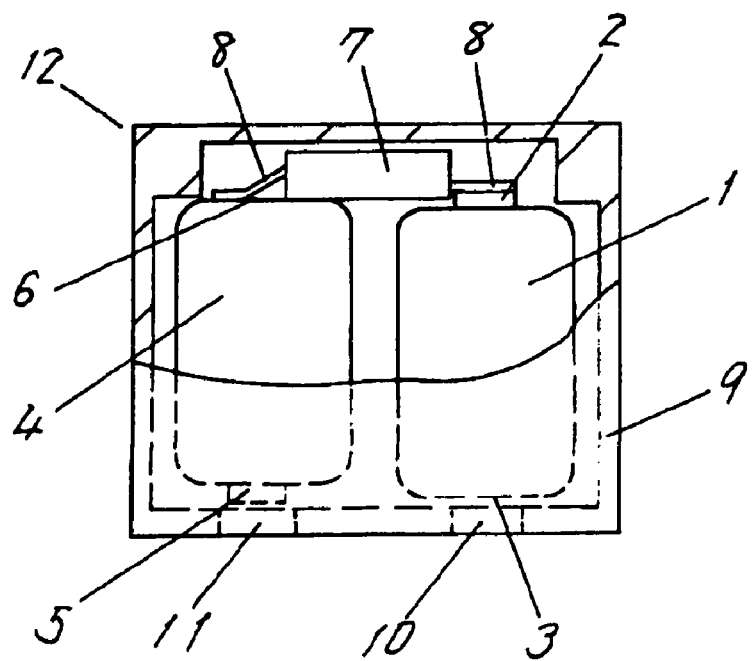
FIG. 10B is a front view of a conventional battery pack, where part of the case has been cut off.
Figure 11A:
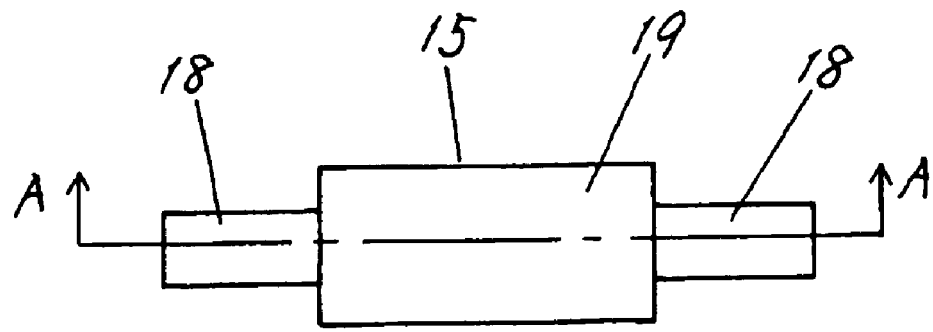
FIG. 11A is a top view of a PTC thermistor with leads.
Figure 11B:
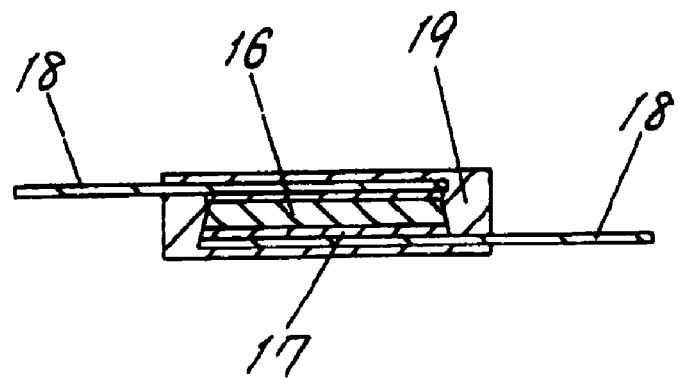
FIG. 11B is a cross sectional view of the PTC thermistor, sectioned along the line A—A of FIG. 11A.
Figure 12:
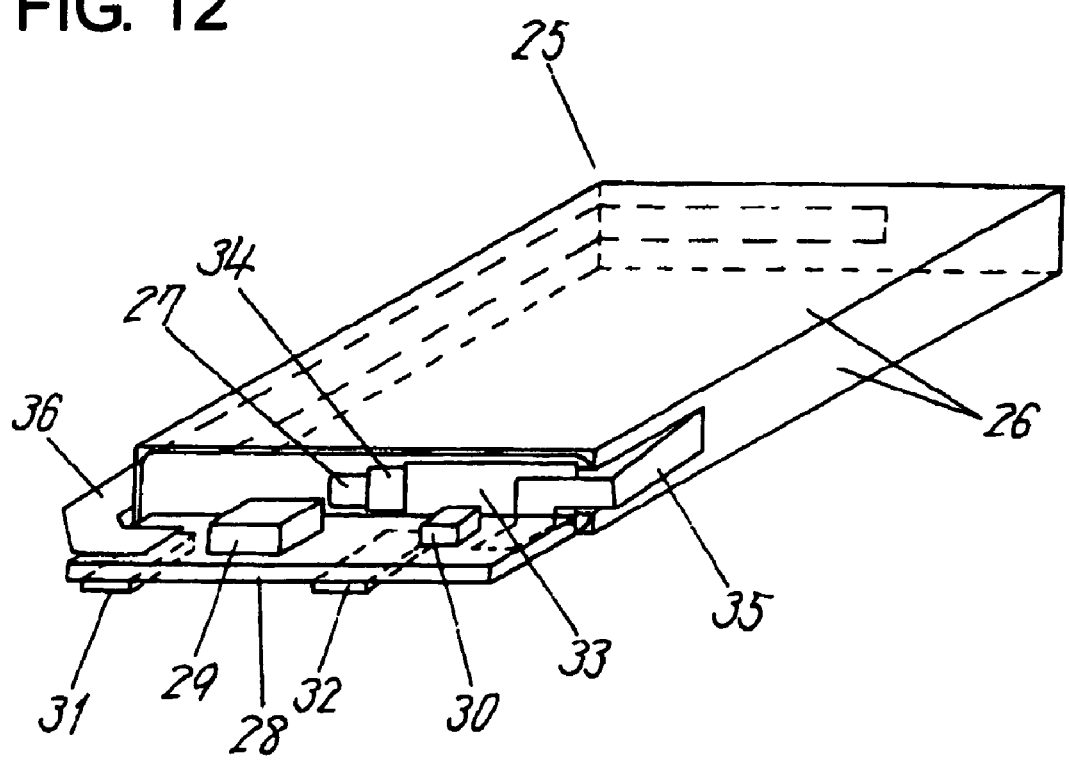
FIG. 12 is a perspective view of a conventional battery pack having protection circuit.
Figure 13:
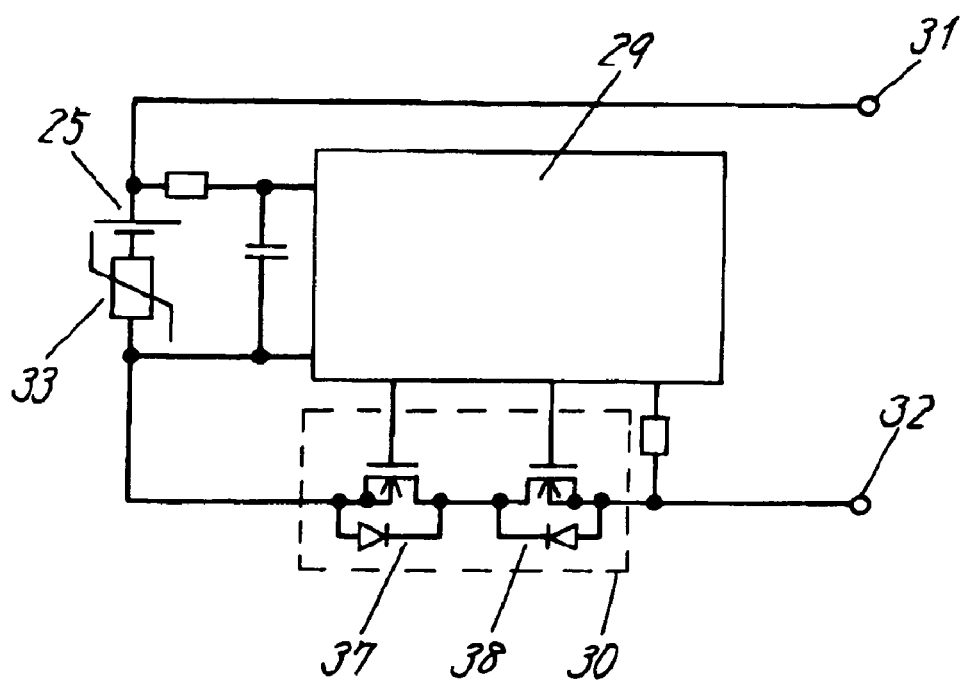
FIG. 13 is the circuit block diagram.

The surface-mount type PTC thermistor in the present embodiment 6 is connected, as shown in FIG. 8, in the circuit between the negative terminal of prismatic battery cell and the FET, so that it is in a thermally coupled state with the FET unit. When it is connected in another arrangement as shown in FIG. 9, where a surface-mount type PTC thermistor 161 is connected in the circuit between prismatic battery cell 162 and positive lead out terminal 163, the surface-mount type PTC thermistor 161 is in a thermally coupled state with the FET unit 164. Temperature rise due to heat generation is slower with the positive terminal 163 of prismatic battery pack 162 which has a larger thermal capacitance. Therefore, the surface-mount type PTC thermistor 161 is influenced less by the heat of prismatic battery cell 162, and it is put into protection operation mainly by the heat generation of the FET unit 164.

The solder used for mounting the components on the printed circuit board in the present embodiment 6 is a lead-free solder of SnAg alloy or SnCu alloy. Other lead-free solders or a conventional SnPb system solder may be used instead for the purpose.

INDUSTRIAL APPLICABILITY

The protection circuit unit in the present invention is formed as an integrated body consisted of a protection IC and a surface-mount type PTC thermistor. This has made it possible to attach a surface-mount type PTC thermistor, with which no lead-bending or welding is required, direct in the protection circuit unit. As the result, influence of stress caused by the mounting work is eliminated, and irreversible shift in the resistance is reduced. Furthermore, even if a heat treatment is applied at a temperature higher than melting point of the polymer, the resultant plus-ward shift in the resistance of surface-mount type PTC thermistor can be reduced by providing a heat treatment process after the PTC thermistor is soldered on printed circuit board. Thus a battery pack having a higher performance and a longer operating time is provided, as well as a method for manufacturing.

What is claimed is:

1. A battery pack comprising:
    a battery cell; and
    a protection circuit unit for protecting said battery cell from overcurrent or overheating, wherein:
    said protection circuit unit is an integrated body containing a protection IC and a printed circuit board mounted with a surface-mount type PTC thermistor,
    a heat conductive member thermally coupling said battery cell and said PTC thermistor member, and said heat conductive member is a soldering metal or a metal alloy whose melting point is 300° C. or lower.

2. The battery pack of claim 1, wherein said heat conductive member comprises a metal plate.

3. The battery pack of claim 1, wherein
    a surface along the thickness direction of said printed circuit board is close to at least one surface of said battery cell, and
    said PTC thermistor is mounted on an end portion of said printed circuit at a location close to said battery cell.

4. The battery pack of claim 1, wherein
    a first mounting surface of said printed circuit board is located adjacent said battery cell, and
    said PTC thermistor is mounted on said first mounting surface.

5. The battery pack of claim 4, wherein at least two metal terminals are connected on a second mounting surface which is on the opposite side of said printed circuit board from the first mounting surface.

6. The battery pack of claim 5, wherein
    said at least two metal terminals are bent in the direction of the first mounting surface at portions extruding from said printed circuit board, and
    at least a part of said bent portion is connected to an insulation sheet provided on a surface of said battery cell.

7. The battery pack of claim 1, wherein said PTC thermistor is electrically connected to an electrode having smaller thermal capacitance, among positive and negative electrodes of said battery cell, said positive and negative electrodes having different thermal capacitance.

8. The battery pack of claim 1, wherein said PTC thermistor is located where it receives minimal thermal influence from said battery cell.

9. The battery pack of claim 8, wherein
    a surface along a thickness direction of said printed circuit board is close to at least one surface of said battery cell, and
    said PTC thermistor is mounted on an end portion of said printed circuit at a location close to said battery cell.

10. The battery pack of claim 1, wherein said protection circuit unit further comprises an FET.

11. The battery pack of claim 10, wherein said FET is mounted on said printed circuit board.

12. The battery pack of claim 11, wherein said PTC thermistor and said FET are mounted on said printed circuit board in proximity to each other.

13. The battery pack of claim 12, wherein said PTC thermistor and said FET are electrically connected.

14. The battery pack of claim 12, wherein said PTC thermistor is electrically connected to an electrode of the battery cell having greater thermal capacitance, among positive and negative electrodes of said battery cell, each having different thermal capacitance.

15. The battery pack of claim 10, wherein said PTC thermistor is located where it receives minimal thermal influence from said FET.

16. The battery pack of claim 10, wherein said PTC thermistor located where it receives minimal thermal influence from said battery cell and said FET.

17. A method of manufacturing a battery pack comprising:
(a) soldering a protection IC and a surface-mount type PTC thermistor on a printed circuit board;
(b) heat-treating said printed circuit board after step (a);
(c) connecting connection leads to a positive electrode and a negative electrode respectively, of a battery cell; and
(d) electrically connecting each of said connection leads.

18. The method of manufacturing a battery pack of claim 17, wherein a temperature of said heat treatment is lower than a protection-operation temperature of said PTC thermistor.

19. The method of manufacturing a battery pack of claim 18, wherein a heat treatment at high temperature and a heat treatment at low temperature are repeated in step (b).

20. A method of manufacturing a battery pack comprising:
(a) soldering a protection IC and a surface-mount type PTC thermistor on a printed circuit board;
(b) heat-treating said printed circuit board after step (a);
(c) electrically-connecting connection leads for a positive electrode and a negative electrode on said printed circuit board; and
(d) connecting said connection leads to a positive electrode and a negative electrode, respectively, of a battery cell after step (c).

21. The method of manufacturing a battery pack of claim 20, wherein a temperature of said heat treatment is lower than a protection-operation temperature of said surface-mount type PTC thermistor.

22. The method of manufacturing a battery pack of claim 21, wherein a heat treatment at high temperature and a heat treatment at low temperature are repeated in step (b).

23. A method of manufacturing a battery pack comprising:
(a) soldering a protection IC and a surface-mount type PTC thermistor on a printed circuit board;
(b) connecting connection leads to a positive electrode and a negative electrode, respectively, of a battery cell after step (a);
(c) electrically connecting each of said connection leads on said printed circuit board; and
(d) heat treating said battery cell and said printed circuit board, after step (c).

24. The method of manufacturing a battery pack of claim 23, wherein a temperature of said heat treatment is lower than a protection-operation temperature of said surface-mount type PTC thermistor.

25. The method of manufacturing a battery pack of claim 24, wherein a heat treatment at high temperature and a heat treatment at low temperature are repeated in step (d).

26. A method of manufacturing a battery pack comprising:
(a) soldering a protection IC and a surface-mount type PTC thermistor on a printed circuit board;
(b) electrically connecting connection leads for a positive electrode, respectively, and a negative electrode on said printed circuit board after step (a);
(c) connecting said connection leads with a positive electrode and a negative electrode, respectively, of a battery cell; and
(d) heat-treating said battery cell and said printed circuit board, after step (c).

27. The method of manufacturing a battery pack of claim 26, wherein a temperature of said heat treatment is lower than a protection-operation temperature of said surface-mount type PTC thermistor.

28. The method of manufacturing a battery pack of claim 27, wherein a heat treatment at relatively higher temperature and a heat treatment at relatively lower temperature is repeated in step (d).

* * * * *

UNITED STATES PATENT AND TRADEMARK OFFICE
CERTIFICATE OF CORRECTION

PATENT NO. : 6,994,926 B2
APPLICATION NO. : 10/311631
DATED : February 7, 2006
INVENTOR(S) : Kiyoshi Ikeuchi et al.

It is certified that error appears in the above-identified patent and that said Letters Patent is hereby corrected as shown below:

Column 19

Line 15, "thermistor located" should read --thermistor is located--.

Signed and Sealed this

Eleventh Day of July, 2006

JON W. DUDAS
*Director of the United States Patent and Trademark Office*